United States Patent
Iwasa

(10) Patent No.: US 6,721,933 B2
(45) Date of Patent: Apr. 13, 2004

(54) INPUT/OUTPUT CELL PLACEMENT METHOD AND SEMICONDUCTOR DEVICE

(75) Inventor: Yoshiro Iwasa, Hino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/984,219

(22) Filed: Oct. 29, 2001

(65) Prior Publication Data

US 2002/0056857 A1 May 16, 2002

(30) Foreign Application Priority Data

Nov. 10, 2000 (JP) ........................... 2000-343309

(51) Int. Cl.[7] ............... G06F 17/50; G06F 9/45; G06F 9/455
(52) U.S. Cl. ................... 716/10; 716/8; 716/11
(58) Field of Search ................. 716/10, 8, 11

(56) References Cited

U.S. PATENT DOCUMENTS

| | | | | |
|---|---|---|---|---|
| 4,577,276 A | * | 3/1986 | Dunlop et al. ............ 716/10 |
| 5,051,917 A | * | 9/1991 | Gould .................... 716/17 |
| 5,519,631 A | * | 5/1996 | Nishioka et al. .......... 716/10 |
| 5,581,109 A | | 12/1996 | Hayashi et al. |
| 5,604,710 A | * | 2/1997 | Tomishima et al. ..... 365/230.03 |
| 5,798,541 A | * | 8/1998 | Jassowski ................ 257/202 |
| 5,825,662 A | * | 10/1998 | Trimberger ............... 716/3 |
| 5,838,627 A | * | 11/1998 | Tomishima et al. ..... 365/230.03 |
| 5,910,733 A | * | 6/1999 | Bertolet et al. ........... 326/41 |
| 5,952,684 A | * | 9/1999 | Tashiro .................. 257/207 |
| 6,054,872 A | * | 4/2000 | Fudanuki et al. ........... 326/39 |
| 6,130,550 A | * | 10/2000 | Zaliznyak et al. ........... 326/39 |
| 6,130,852 A | * | 10/2000 | Ohtani et al. ......... 365/230.03 |
| 6,144,575 A | * | 11/2000 | Morgan et al. ............ 365/51 |

FOREIGN PATENT DOCUMENTS

| | | |
|---|---|---|
| EP | 0 660 410 A2 | 6/1995 |
| JP | 63-81945 | 4/1988 |
| JP | 3-214658 | 9/1991 |
| JP | 04-051714 | 2/1992 |
| JP | 4-127556 | 4/1992 |
| JP | 4-171756 | 6/1992 |
| JP | 6-13588 | 1/1994 |
| JP | 09-074139 | 3/1997 |
| JP | 10-284611 | 10/1998 |

\* cited by examiner

Primary Examiner—A. M. Thompson
(74) Attorney, Agent, or Firm—Oliff & Berridge, PLC

(57) ABSTRACT

A semiconductor device and an input/output (I/O) cell placement method can cope with reduction of the chip area and increase in the number of pins, without changing a core transistor region inside the semiconductor device. A semiconductor chip of the semiconductor device has a core transistor region, an I/O cell placement region and a pad placement region. At least two columns of I/O cells to be placed in the I/O cell placement region of the semiconductor chip are arranged in a direction perpendicular to the arranging direction of pads arranged along the outer peripheral portion of the semiconductor chip and in such a manner that the longitudinal direction (height directions) of the chip is parallel to the pad arranging direction.

16 Claims, 11 Drawing Sheets

INPUT/OUTPUT CELL PLACEMENT METHOD AND SEMICONDUCTOR DEVICE

Japanese Patent Application No. 2000-343309, filed Nov. 10, 2000, is hereby incorporated by reference in its entirety.

TECHNICAL FIELD

The present invention relates to an I/O cell placement method and a semiconductor device using the same.

BACKGROUND

In some semiconductor devices which include a semiconductor chip of silicon or the like where an integrated circuit is formed, input/output cells (hereinafter called "I/O cells") which have an interface capability with respect to an external circuit are arranged along the outer peripheral portion of the chip. In this case, pads as electrodes to electrically connect to the external circuit may be placed in a portion located further outward of the I/O cells. The individual pads are electrically connected to the corresponding I/O cells. The I/O cells include a circuit for connecting the integrated circuit formed in the semiconductor chip to the external circuit.

SUMMARY

One aspect of the invention relates to an I/O cell placement method for placing I/O cells which are included in a semiconductor device electrically connected to a given external device and have electric interface function with respect to the external device, the method comprising a step of placing at least two columns of I/O cells from an outer peripheral portion of a chip toward a chip core portion in such a manner that a longitudinal direction of each of the I/O cells is parallel to an outer peripheral portion.

Another aspect of the invention relates to a semiconductor device electrically connected to a given external device, comprising at least two columns of I/O cells which are placed from an outer peripheral portion of a chip toward a chip core portion in such a manner that longitudinal direction of the I/O cell is parallel to the outer peripheral portion and have an electric interface function with respect to the external device.

DETAILED DESCRIPTION

An embodiment of the invention is described below.

The embodiment to be discussed below in no way restricts the subject matters of the invention recited in the appended claims. It is to be also noted that not all the structural elements of the embodiment that will be discussed hereunder are essential to the invention.

In case where a semiconductor device is designed in a gate array, for example, an integrated circuit having desired functions is realized by connecting basic cells prearranged in an array form by the interconnects that are correspond with a circuit designed by a user. At this time, I/O cells likewise prearranged are connected to the basic cells at the outer peripheral portion of a semiconductor chip by the interconnects and the connected I/O cells perform an interface operation with an external circuit via corresponding pads.

Figure 11:
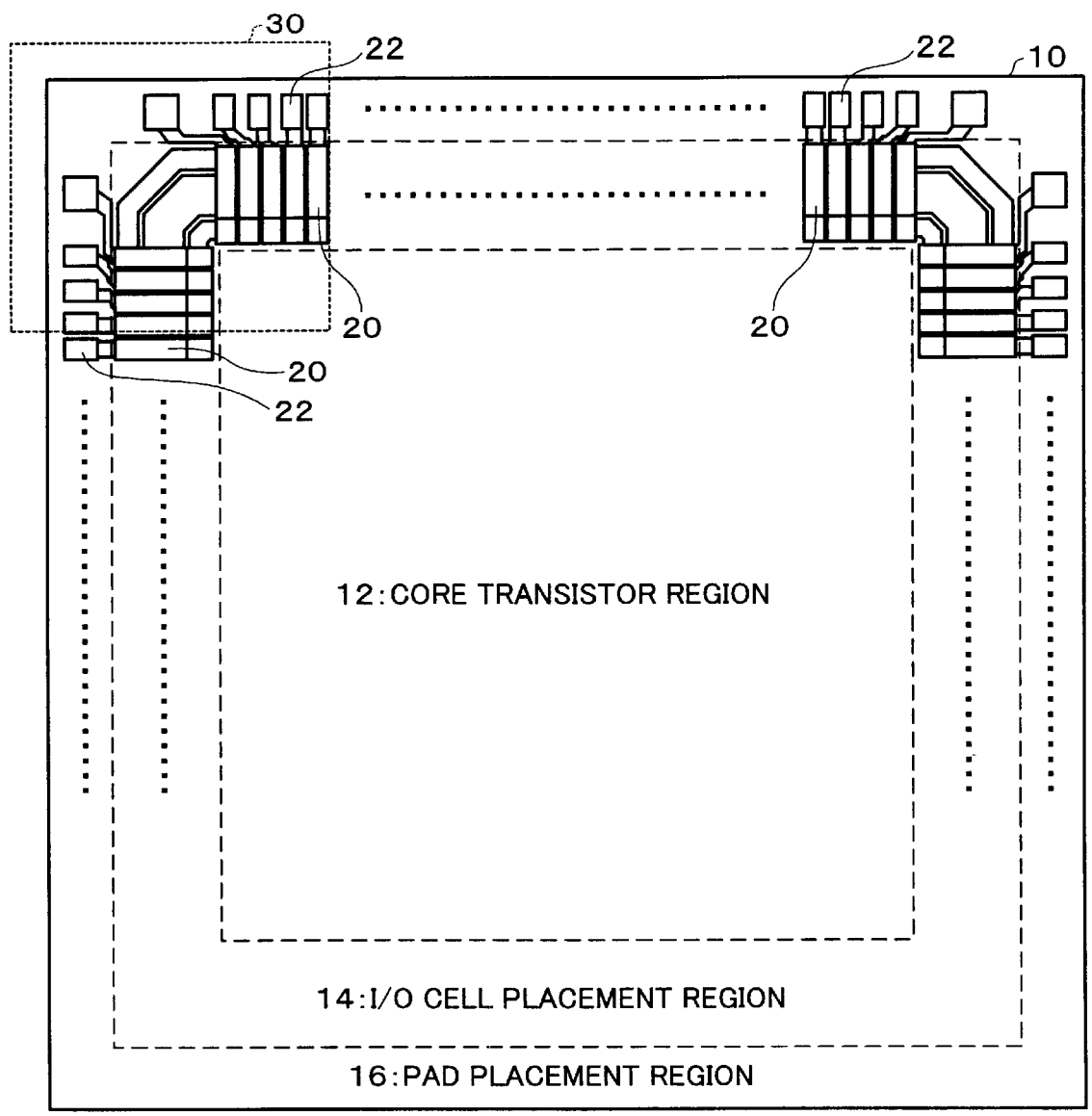
FIG. 11 is an explanatory diagram showing one example of the layout of a semiconductor chip as a comparative example.

FIG. 11 shows one example of the layout of such a semiconductor chip.

This semiconductor device includes a semiconductor chip 10 of silicon or the like, which includes a core transistor region 12, an I/O cell placement region 14 and a pad placement region 16.

The core transistor region 12 is a region where basic cells are arranged in an array form in case of, for example, a gate array. The individual basic cells have their own functions and provide an operational circuit, which has obtained a given function by connecting one another with interconnection.

The I/O cell placement region 14 is provided along the outer periphery of the core transistor region 12 and a plurality of I/O cells 20 are arranged in the I/O cell placement region 14. The I/O cells 20 include input/output circuits each having a capability of interfacing a circuit outside the semiconductor chip 10 with the operational circuit in the core transistor region 12.

The pad placement region 16 is provided along the outer periphery of the I/O cell placement region 14 and a plurality of pads 22 are arranged in the pad placement region 16. The pads 22 are electrodes for electrically connecting an external circuit of the semiconductor chip 10 with the input/output circuits in the I/O cell placement region 14.

Figure 12:
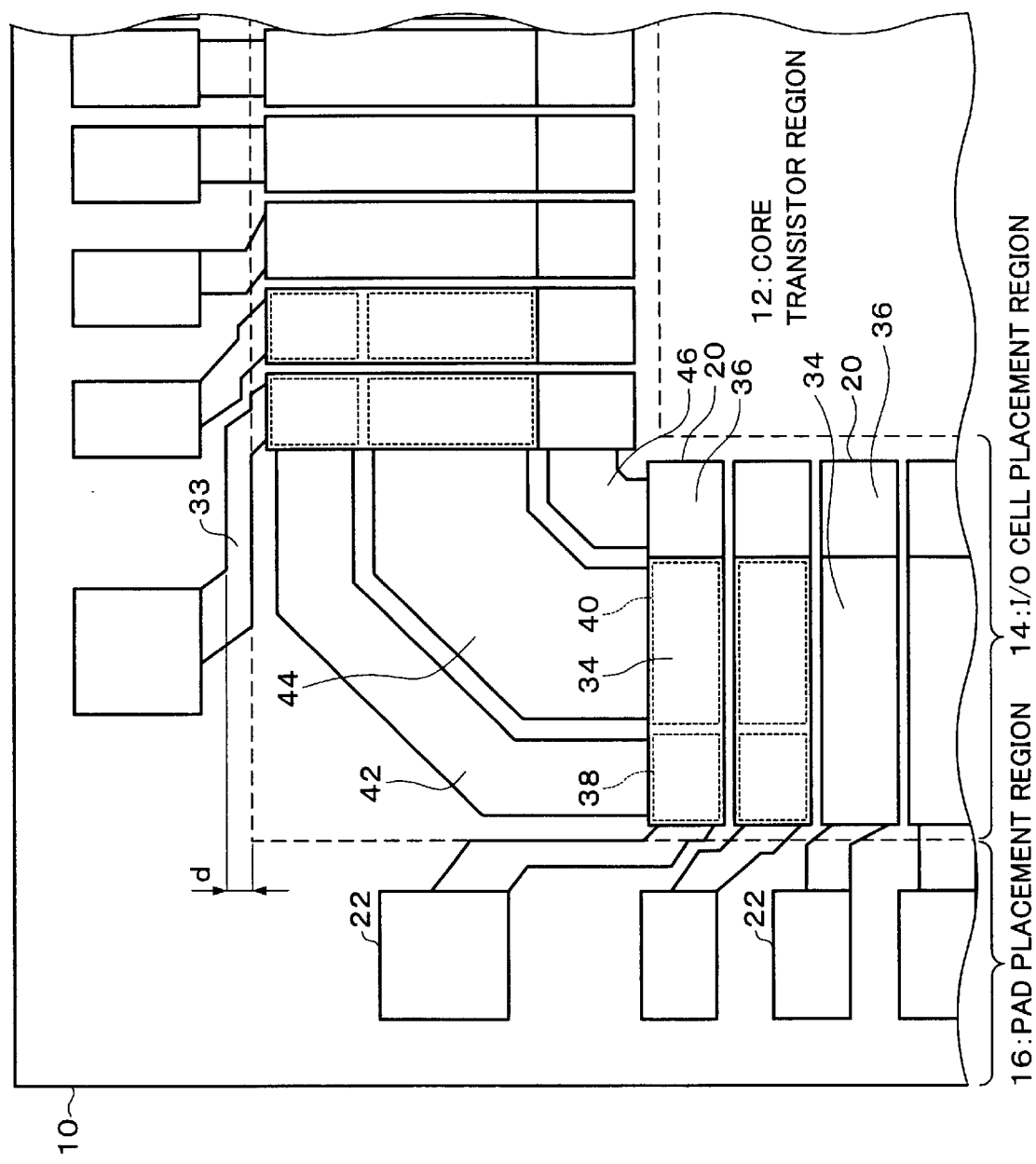
FIG. 12 is a partly enlarged view of that one example of the layout of the semiconductor chip as the comparative example.

FIG. 12 presents an enlarged view of a broken-lined portion 30 in the semiconductor chip 10 shown in FIG. 11.

The I/O cells 20 arranged in the I/O cell placement region 14 have pad connection terminals through which they are electrically connected to the corresponding pads 22 by corresponding lead lines 33.

Each of the I/O cells 20 includes a driver circuit section 34 and an interface circuit section 36.

The driver circuit section 34 has a driver, such as an input driver or an output driver, and includes an N-type transistor region 38 and a P-type transistor region 40.

The interface circuit section 36 includes a level shifter circuit, which converts different signal levels, as an interface circuit between the driver circuit section 34 and the basic cells formed in the core transistor region 12. In case where the external circuit operates on a signal level of a 5-volt range and the core transistor region 12 operates on a signal level of a 3-volt range, the interface circuit section 36 converts the 5-volt range signal level from the external circuit to a 3-volt range signal level or converts the 3-volt range signal level from the core transistor region 12 to a 5-volt range signal level.

The driver circuit section 34 and the interface circuit section 36 are electrically connected with a power-supply level supply line and a ground-level supply line, so that individual transistors in the N-type transistor region 38 and the P-type transistor region 40 operate according to the difference between the potential supplied through the power-supply level supply line and the potential supplied through the ground-level supply line.

A ground-level supply line 42 which feeds the potential of the ground level to the driver circuit section 34, a power-supply level supply line 44 which feeds the potential of the power-supply level to the driver circuit section 34, and a power-supply/ground level supply line 46 which feeds the potentials of the power-supply level and the ground level to the interface circuit section 36 are placed in the I/O cell placement region 14. Those supply lines 42, 44 and 46 are designed by first and second interconnection layers and are arranged in a ring form on the semiconductor chip 10.

To arrange as many pads 22 as possible at the outermost peripheral portion of the semiconductor chip 10 in such a semiconductor device, the I/O cells 20 are constructed in rectangular shapes and are placed in such a manner that their longitudinal direction (height directions) become perpendicular to the placement direction of the pads. This would raise a problem of increasing the area of the semiconductor chip 10 by the portion corresponding to the height-directional lengths of the I/O cells.

In case where bonding is carried out at the corner portions of the semiconductor chip 10 as shown in FIG. 12, particularly, the closer to the chip corner the pads 22 pads 22 are placed, the longer the distance should be taken between the adjoining pads in order to avoid contact between the bonding wires connected to the adjoining pads. This requires that the lead line 33 for electrically connecting such a pad to the corresponding I/O cell should be bent, thus increasing the area of the semiconductor chip by the width, d, of the lead line 33.

As the width (short length) of the I/O cell would be defined as the minimum pad pitch, it was not possible to make the pad pitch narrower. The semiconductor device according to the related art therefore would face incapability of coping with the possible increase in the number of pins in the future diversification of functions.

The embodiment has been devised in view of the above-described technical problems and can provide an I/O cell placement method and a semiconductor device, which can reduce the chip area without changing the internal core transistor region.

According to this embodiment can also provide an I/O cell placement method and a semiconductor device which can realize the increase in the number of pins that matches with the future diversification of functions can be provided, without changing the internal core transistor region.

The embodiment relates to an I/O cell placement method for placing I/O cells which are included in a semiconductor device electrically connected to a given external device and have electric interface function with respect to the external device, the method comprising a step of placing at least two columns of I/O cells from an outer peripheral portion of a chip toward a chip core portion in such a manner that a longitudinal direction of each of the I/O cells is parallel to an outer peripheral portion.

Here, the "given external device" means, for example, an operational circuit outside the semiconductor device according to the invention.

The "longitudinal direction" is the longitudinal direction of an I/O cell which is the direction of the long side of the I/O cell which is normally constructed in a rectangular shape, or the so-called height direction of the I/O cell.

The outer peripheral portion of the chip indicates the portion according to the invention and constitutes the outer periphery of the semiconductor chip which is included in the semiconductor device. The chip core portion indicates an operational circuit region formed in the center portion of the chip.

As plural columns of I/O cells are arranged from the outer peripheral portion of the chip toward the chip core portion in such a manner that the height directions of the I/O cells become parallel to the outer peripheral portion of the chip, it is possible to improve the degree of freedom of the placement positions of the pads that are normally restricted not only by the shapes of the pads but also by the widths of the I/O cells. This can make it possible to cope with various kinds of packages without altering the design of the chip core portion.

In this embodiment, a plurality of pads may be placed along the outer peripheral portion of the chip, and the pads may be electrically connected to corresponding I/O cells respectively.

While the chip area is inevitably increased by the portion corresponding to the height direction of the I/O cells to be placed, plural columns of I/O cells are placed in such a manner that the longitudinal direction of the I/O cells become parallel to the placement direction of the pads, so that the longitudinal-directional length of the I/O cells becomes shorter than the height-directional length. This can reduce the area of the chip that has the same functions without altering the design of the chip core portion.

In this embodiment, the plurality of pads may be placed at a region closer to a chip core portion than the I/O cells, and the pads may be electrically connected to corresponding I/O cells respectively.

Here, the placement of the pads in the chip core portion means the placement of pads in the so-called core transistor region as in the case of, for example, active surface bumps. Even in this case, particularly, arranging plural columns of I/O cells in such a manner that their longitudinal direction is parallel to the placement direction of the pads. This also makes it possible to reduce the area of the chip that has the same functions without altering the design of the chip core portion.

In this embodiment, when A is a longitudinal length of a region of the I/O cell and B is another length of a region of the I/O cell, [A/B] or fewer columns of I/O cells may be placed in such a manner that longitudinal direction of the I/O cells are parallel to one another.

Here, given that A is the longitudinal length (e.g., the height direction) of the region of the I/O cell and B is the other length (e.g., the short-side or width direction), [A/B] is expressed as the largest integer not exceeding A/B.

According to the embodiment, if the number of plural columns of I/O cells is equal to or smaller than [A/B], it is possible to make the pad pitch wider than that demanded in the related art and to avoid an increase in the chip area that is caused by the height-directional length of the I/O cells or rather reduce the chip area. In view of the point that the alteration of the design of the chip core portion is unnecessary, it is possible to effectively achieve cost reduction.

In this embodiment, when A is a longitudinal length of a region of the I/O cell and B is another length of a region of the I/O cell, more than [A/B] columns of I/O cells may be placed in such a manner that longitudinal direction of the I/O cells are parallel to one another.

According to this embodiment, the placement of more than [A/B] columns of I/O cells in such a manner that the longitudinal direction of the I/O cells become parallel to one another lifts off the limitation on the number of arrangeable pads that is inevitably put in the related art as the number of I/O cells becomes large. This brings about a new advantage that makes it possible to realize the increase in the number of pins that matches with the future diversification of functions.

According to this embodiment, each of the I/O cells may be a plurality of regions including first and second regions to which first and second power sources are respectively connected, and the I/O cells may be placed so that the second region of each of the I/O cells to which the second power source is connected faces each other when the I/O cells are adjoining each other in the longitudinal direction.

As those regions to which the same power is supplied are so arranged as to face one another, the power supply line or the ground line can be shared in addition to the aforementioned advantage. This improves the degree of freedom of interconnection and makes the interconnects wider to effectively take the EMI measures.

According to this embodiment, a level of the second power source may be a level of power source to be supplied to the chip core portion, and a level shifter circuit which performs signal level conversion between a level of the first power source and a level of the second power source may be located in the second region to which a level of the second power source is supplied.

The embodiment can be adapted to a semiconductor device which is used in a multi-power system and can allow the semiconductor device to operate on a low voltage, thus reducing the power consumption.

According to this embodiment, at least layers other than interconnection layers in the I/O cells may be same in case where the I/O cells are placed in a first state and in case where the I/O cells are placed in a second state which is a rotated first state.

According to this embodiment, as I/O cells can be placed freely in accordance with the number of pads and the sizes of the package or the chip core portion, every semiconductor device can be designed to have the optimal chip size. Particularly, the provision of sharable I/O cells eliminates the need to change the design of the chip core portion, so that a variety of semiconductor devices having the optimal chip sizes can be developed at a low cost.

According to this embodiment, in the I/O cells, a level of a power-supply may be supplied through a first interconnection layer in the first state and a level of the power-supply may be supplied through a second interconnection layer connected to the first interconnection layer in the second state.

According to this embodiment, I/O cells that can be shared can be adopted even in a multi-power semiconductor device, making it possible to easily lay annular power lines that can provide the I/O cells with, for example, the power-supply level and the ground level.

The embodiment also relates to a semiconductor device electrically connected to a given external device, comprising at least two columns of I/O cells which are placed from an outer peripheral portion of a chip toward a chip core portion in such a manner that longitudinal direction of the I/O cell is parallel to the outer peripheral portion and have an electric interface function with respect to the external device.

The embodiment may include a plurality of pads placed at a region closer to a chip core portion than the I/O cells and electrically connected to corresponding I/O cells respectively.

The embodiment may include pads placed closer to the chip core portion than the I/O cells and electrically connected to corresponding I/O cells.

According to this embodiment, when A is a longitudinal length of a region of the I/O cell and B is another length, [A/B] or fewer columns of I/O cells may be placed in such a manner that longitudinal direction of the I/O cells are parallel to one another.

According to this embodiment, when A is a longitudinal length of a region of the I/O cell and B is another length, more than [A/B] columns of I/O cells may be placed in such a manner that longitudinal direction of the I/O cells are parallel to one another.

According to this embodiment, each of the I/O cells may have a plurality of regions including first and second regions to which first and second power sources are respectively connected, and the I/O cells may be placed so that the second region of each of the I/O cells to which the second power source is connected faces each other when the I/O cells are adjoining each other in the longitudinal direction.

According to this embodiment, a level of the second power source may be a level of power source to be supplied to the chip core portion, and a level shifter circuit which performs signal level conversion between a level of the first power source and a level of the second power source may be located in the second region to which a level of the second power source is supplied.

One embodiment is elaborated below with reference to the accompanying drawings.

1. Semiconductor Device According to the Embodiment

Figure 1:
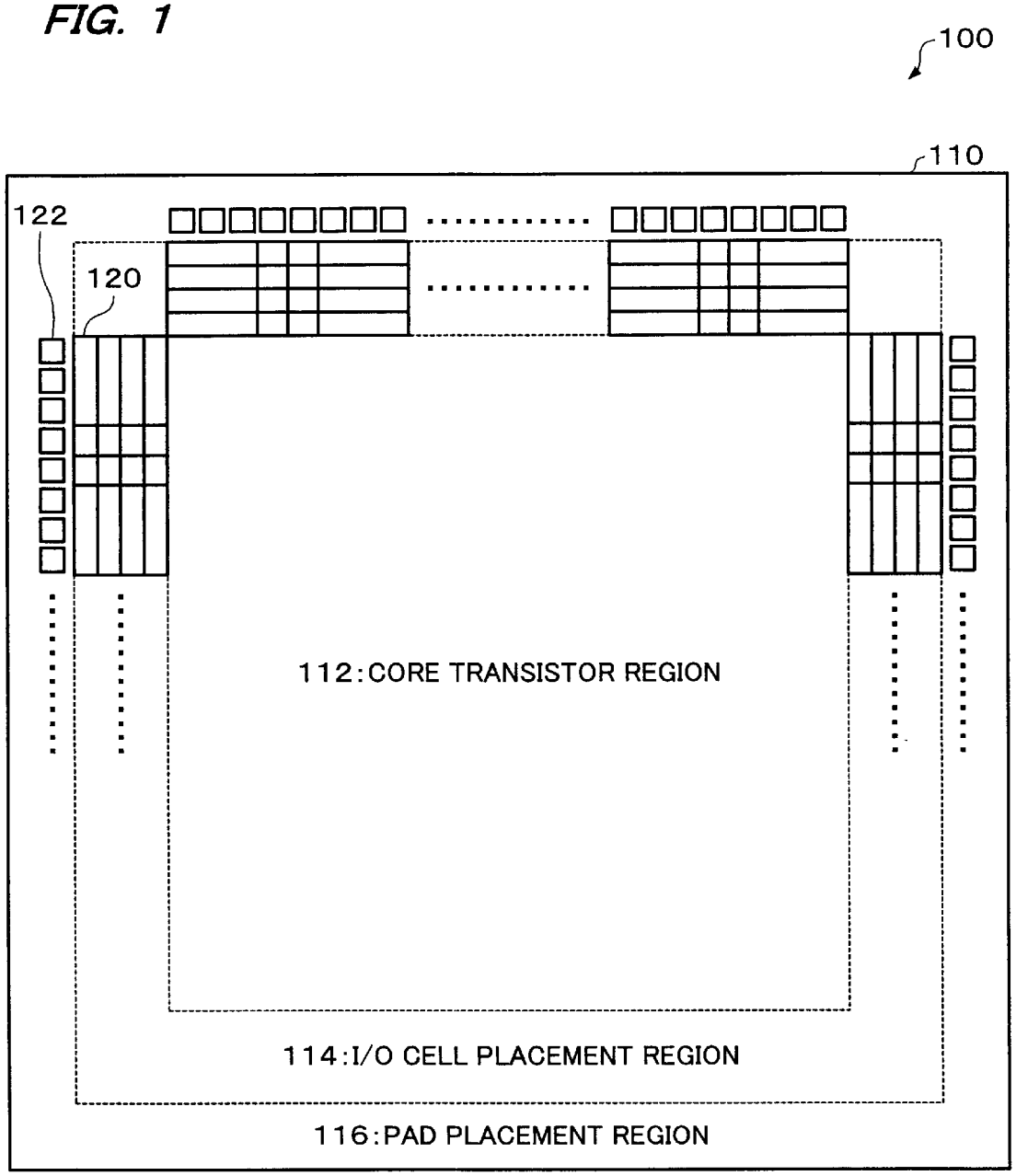
FIG. 1 is an explanatory diagram showing one example of the layout of a chip of a semiconductor device according to one embodiment.

FIG. 1 shows one example of the layout of a chip of a semiconductor device according to the embodiment.

The illustration of the power-supply level supply line and the ground-level supply line that respectively supply I/O cells with the power-supply level and the ground level is omitted.

A semiconductor device 100 according to the embodiment includes a semiconductor chip 110 of silicon or the like. Unillustrated connection terminals are electrically connected to the pads of the semiconductor chip 110.

The semiconductor chip 110 has a core transistor region 112, an I/O cell placement region 114 and a pad placement region 116.

The core transistor region 112 is a region where basic cells are arranged in an array form in case of, for example, a gate array. As those basic cells are interconnected together via an interconnection layer, an operational circuit which is designed by a user and has a given function is constructed.

The I/O cell placement region 114 is provided along the outer periphery of the core transistor region 112 and a plurality of I/O cells 120 are place in the I/O cell placement region 114. The I/O cells 120 include input circuits, output circuits or input/output circuits each having a capability of interfacing a circuit outside the semiconductor chip 110 with the operational circuit in the core transistor region 112. A power-supply level supply line and a ground-level supply line that respectively supply the power-supply level and the ground level to the placed I/O cells 120 are arranged in a ring form in the I/O cell placement region 114.

The pad placement region 116 is provided along the outer periphery of the I/O cell placement region 114 a plurality of pads 122 are placed in the pad placement region 116. The pads 122 are electrodes for electrically connecting an external circuit of the semiconductor chip 110 with the input circuits, output circuits or input/output circuits in the I/O cell placement region 114.

The semiconductor device 100 according to the embodiment has a first feature such that at least two columns of I/O cells 120 to be placed in the I/O cell placement region 114 of the semiconductor chip 110 have rectangular shapes and are placed in such a manner that the longitudinal direction (height directions) of the I/O cells become parallel to the placement direction of the corresponding pads (the direction parallel to the outer peripheral portion of the chip) and are stacked in a direction perpendicular to the placement direction of the pads.

Figure 2:
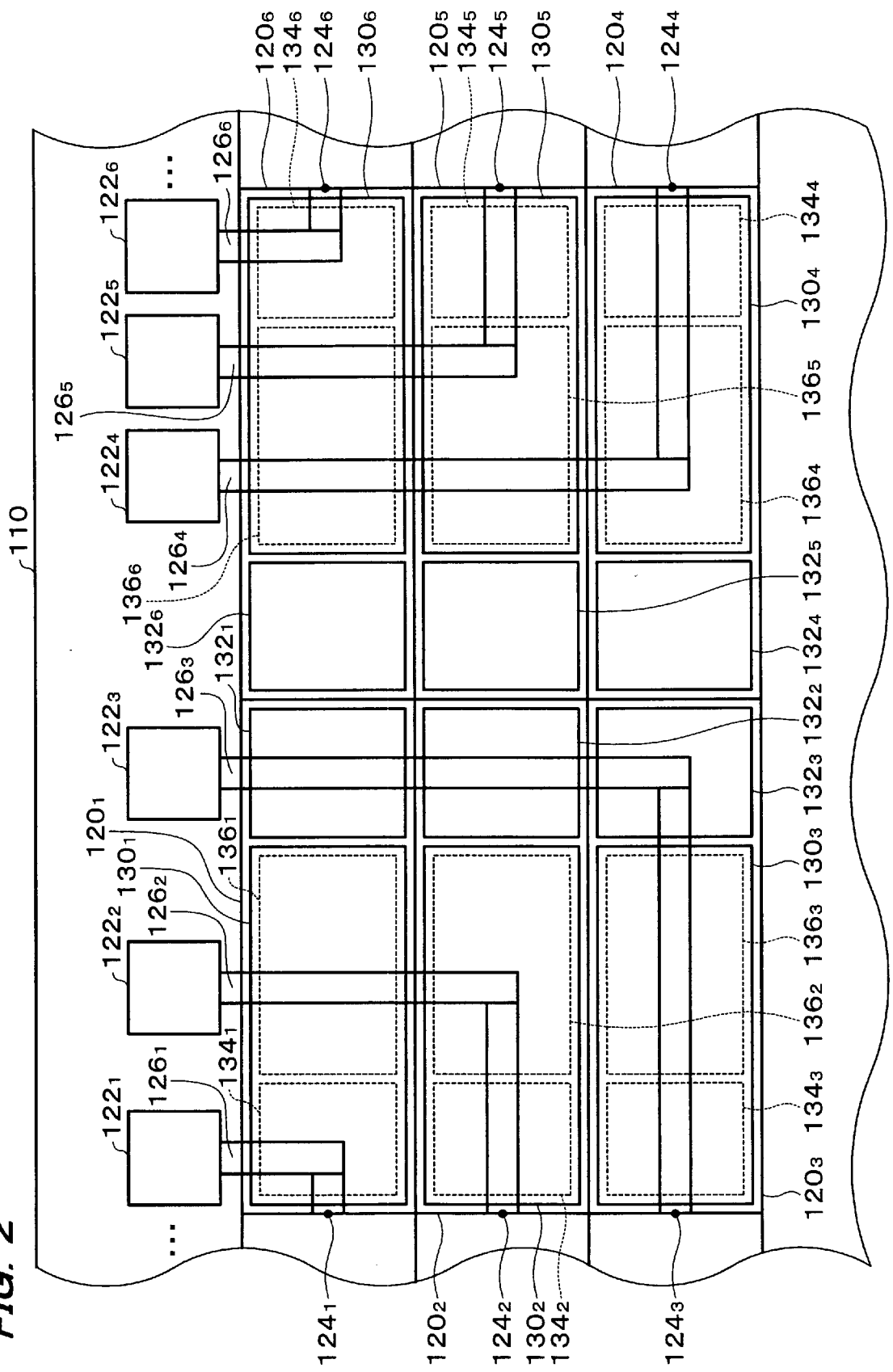
FIG. 2 is a schematic diagram showing a first example of I/O cells placed on the chip of the semiconductor device according to the embodiment.

FIG. 2 schematically shows a first example of I/O cells placed on the semiconductor chip of the semiconductor device according to the embodiment.

FIG. 2 provides an enlarged view of a part of one side of the semiconductor chip 110.

Three columns of I/O cells $120_1$ to $120_3$ are arranged toward the chip core portion in a direction perpendicular to the placement direction of pads $122_1$ to $122_3$ arranged along the edge portion of the semiconductor chip 110 in such a manner that their longitudinal direction become parallel to one another. Likewise, three columns of I/O cells $120_4$ to $120_6$ are arranged toward the chip core portion in a direction perpendicular to the placement direction of pads $122_4$ to $122_6$ arranged along the edge portion of the semiconductor chip 110 in such a manner that their longitudinal direction become parallel to one another. The I/O cells to be placed include input cells, output cells or input/output cells and are formed in the same shape.

The I/O cells $120_1$ to $120_6$ respectively have pad connection terminals $124_1$ to $124_6$ and are electrically connected to the corresponding pads $122_1$ to $122_6$ by corresponding lead lines $126_1$ to $126_6$ that are placed above the I/O cells. So far, laying the lead lines above I/O cells has produced parasitic elements, which influence the electric characteristics of the input circuits, output circuits or input/output circuits in the I/O cells. However, the degradation of the electric characteristics is avoidable by the recent technique of reducing the signal amplitude.

The I/O cells $120_1$ to $120_6$ respectively include driver circuit sections $130_1$ to $130_6$ and interface circuit sections $132_1$ to $132_6$.

Each of the driver circuit sections $130_1$ to $130_6$ includes an input driver when an corresponding one of the I/O cells $120_1$ to $120_6$ is an input cell, includes an output driver when the corresponding I/O cell is an output cell and includes an input driver and an output driver when the corresponding I/O cell is an input/output cell. The I/O cells $120_1$ to $120_6$, which include such driver circuit sections $130_1$ to $130_6$, have approximately the same shapes, regardless of whether they are input cells, output cells or input/output cells, and respectively include N-type transistor regions $134_1$ to $134_6$ and P-type transistor regions $136_1$ to $136_6$.

The interface circuit sections $132_1$ to $132_6$ respectively include level shifter circuits, which convert signal levels, as interface circuits between the driver circuit sections $130_1$ to $130_6$ and the basic cells formed in the core transistor region 112.

In case where the external circuit operates on a signal level of a 5-volt range and the core transistor region 112 operates on a signal level of a 3-volt range, each level shifter circuit converts the 5-volt range signal level from the external circuit to a 3-volt range signal level or converts the 3-volt range signal level from the core transistor region 112 to a 5-volt range signal level.

Although interconnects are actually placed above the I/O cells $120_1$ to $120_6$ to feed the potentials of the power-supply level and the ground level to the I/O cells, they are not illustrated in FIG. 2.

Further, the semiconductor device of the embodiment has a second feature such that the I/O cells $120_1$ to $120_6$ requires only a single interconnection layer or two to lay signal lines, power supply lines and ground lines of the individual transistors that constitute the internal driver circuit sections $130_1$ to $130_6$ and interface circuit sections $132_1$ to $132_6$, and can be placed, as in the related art, in such a manner that the longitudinal direction of the I/O cells become perpendicular to the placement direction of the pads. In this case, a new interconnection layer or two are added at the time of laying each type of interconnects FIG. 3 schematically shows a second example of I/O cells placed on the semiconductor chip of the semiconductor device according to the embodiment.

Figure 3:
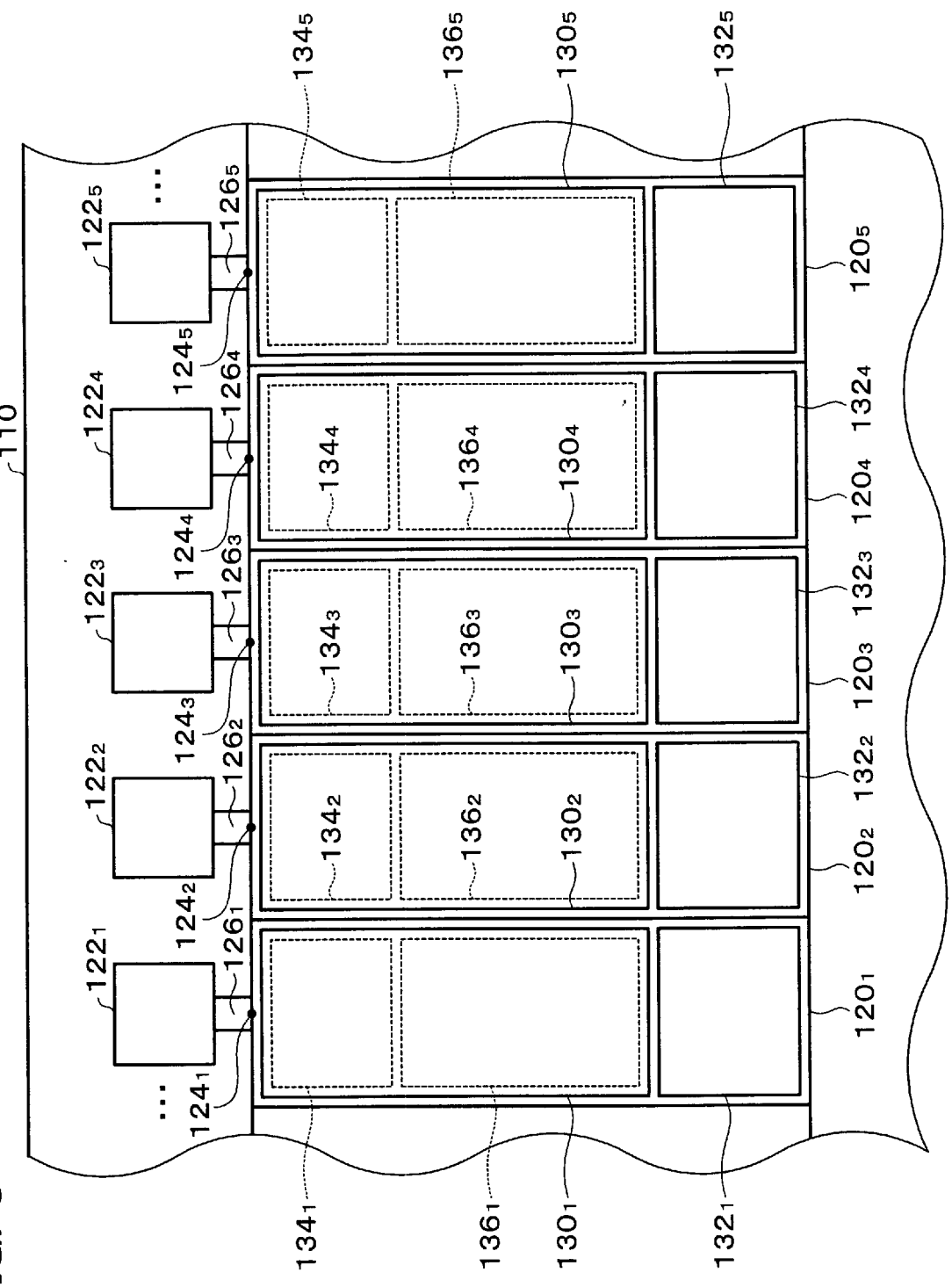
FIG. 3 is a schematic diagram showing a second example of I/O cells placed on the chip of the semiconductor device according to the embodiment.

FIG. 3 shows, in enlargement, a part of one side of the semiconductor chip 110.

It is to be noted that same reference numerals are given to those components in the layout diagram of FIG. 2 to avoid a redundant description whenever possible.

The layout in FIG. 3 differs from that shown in FIG. 2 in that the lead lines $126_1$ to $126_5$ need not be placed above the I/O cells because the pad connection terminals $124_1$ to $124_5$ provided for I/O cells $120_1$ to $120_5$, respectively are located near the corresponding pads $122_1$ to $122_5$.

Although interconnects are actually placed above the I/O cells $120_1$ to $120_5$ to feed the potentials of the power-supply level and the ground level to the I/O cells, they are not illustrated in FIG. 3.

The I/O cells that can be placed flexibly with respect to the placement direction of the pads this way can be placed as shown in either FIG. 2 or FIG. 3 in accordance with the number of pads of the semiconductor device and the shapes of the I/O cells.

Here, the I/O cell 120 has a rectangular shape, the length of the long side (height direction) is A, the length of the short side (width direction) is B, and [A/B] is expressed as the largest integer not exceeding "A/B".

Generally speaking, one side of a pad is shorter than the short side length B. In case where [A/B] or fewer columns of I/O cells 120 are arranged in a direction perpendicular to the placement direction of the pads and [A/B] pads are arranged over the long side length A, therefore, the height-directional length when [A/B] columns of I/O cells are arranged in the width direction, rather than the length A equivalent to the height of the I/O cells 120 can be made shorter. It is therefore possible to reduce the area of the semiconductor chip. This can be done without changing the chip transistor portion, thus reducing the design steps needed, and is therefore advantageous in cost merit.

In case where more than [A/B] columns of I/O cells 120 are arranged in a direction perpendicular to the placement direction of the pads as shown in FIG. 2, it is desirable to arrange the I/O cells 120 rather in the placement direction of the pads as shown in FIG. 3 when the cost merit has a higher priority.

In consideration of the increase in the number of pins, however, when more than [A/B] columns of I/O cells are arranged in a direction perpendicular to the placement direction of the pads as shown in FIG. 2, the pad pitch can be made narrower.

Apparently, the I/O cells that are adapted to the semiconductor device of the embodiment have an improved flexibility to the placement of the pads. This can provide a cost merit as [A/B] or fewer columns of I/O cells 120 are arranged in a direction perpendicular to the placement direction of the pads as shown in FIG. 2, and can also provide an effect of making the pad pitch narrower to be able to cope with the increase in the number of pins as more than [A/B] columns of I/O cells 120 are placed.

As the I/O cells are placed in such a manner that their longitudinal direction become parallel to the placement direction of the pads and the interface circuit sections of the individual I/O cells (e.g., the I/O cells $120_1$, $120_6$) arranged adjacent to each other in the placement direction of the pads as shown in FIG. 2, at least one of the power-supply line and the ground line that are connected to, for example, the interface circuit sections can be placed as a common line.

The following discusses specific examples of the I/O cells that are adapted to the semiconductor device according to the embodiment.

Figure 4:
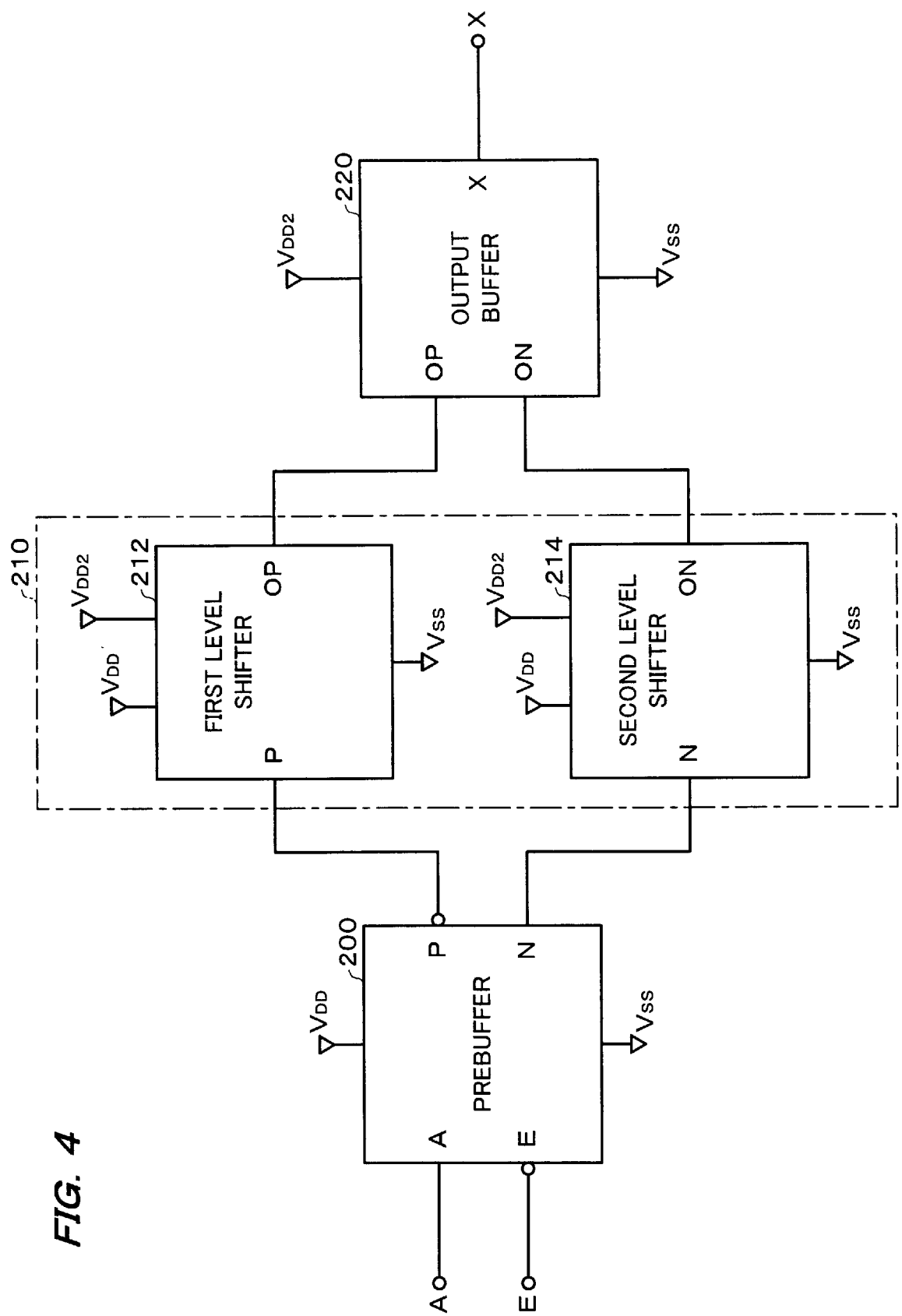
FIG. 4 is a structural diagram showing one example of the circuit structure of an output cell as an I/O cell which is adapted to the semiconductor device according to the embodiment.

2. Specific Examples of I/O Cells Adapted to the Semiconductor Device According to the Embodiment 2.1 Circuit Structure of I/O Cells FIG. 4 shows one example of the circuit structure of an output cell as an I/O cell which is adapted to the semiconductor device according to the embodiment.

This I/O cell includes a prebuffer circuit 200, a level shifter circuit 210 and an output buffer circuit 220. The level shifter circuit 210 includes a first level shifter circuit 212 for controlling P-type transistors in the output buffer circuit 220 and a second level shifter circuit 214 for controlling N-type transistors in the output buffer circuit 220.

It is assumed that the core transistor region 112 operates on a differential potential $V_{DD}$ between the internal power-supply level and the ground level, an external circuit operates on a differential potential $V_{DD2}$ between the power-supply level and the ground level, and $V_{DD2}$ is greater than $V_{DD}$.

The differential potential $V_{DD}$ is supplied to the prebuffer circuit 200 by the power-supply level supply line and the ground-level supply line. The differential potential $V_{DD}$ and differential potential $V_{DD2}$ are respectively supplied to the first and second level shifter circuits 212 and 214 by plural pairs of power-supply level supply lines and ground-level supply lines. The differential potential $V_{DD2}$ is supplied to the output buffer circuit 220 by the power-supply level supply line and the ground-level supply line.

A signal A with a signal level $V_{DD}$ and an enable signal E are supplied to the prebuffer circuit 200 from the core transistor region 112. The first and second level shifter circuits 212 and 214 convert a signal P for controlling P-type transistors and a signal N for controlling N-type transistors, which correspond to the signal A with the signal level $V_{DD}$ and are generated by the prebuffer circuit 200, to signals OP and ON having a signal level of $V_{DD2}$. In response to the signals OP and ON level-converted by the first and second level shifter circuits 212 and 214, the output buffer circuit 220 sends an output signal having a signal level of $V_{DD2}$ to a pad connection terminal X. The pad connection terminal X is electrically connected to the corresponding pad.

The output cell is designed to be able to set the output of the output buffer circuit 220 in a high-impedance state in response to the enable signal E.

Figure 5:
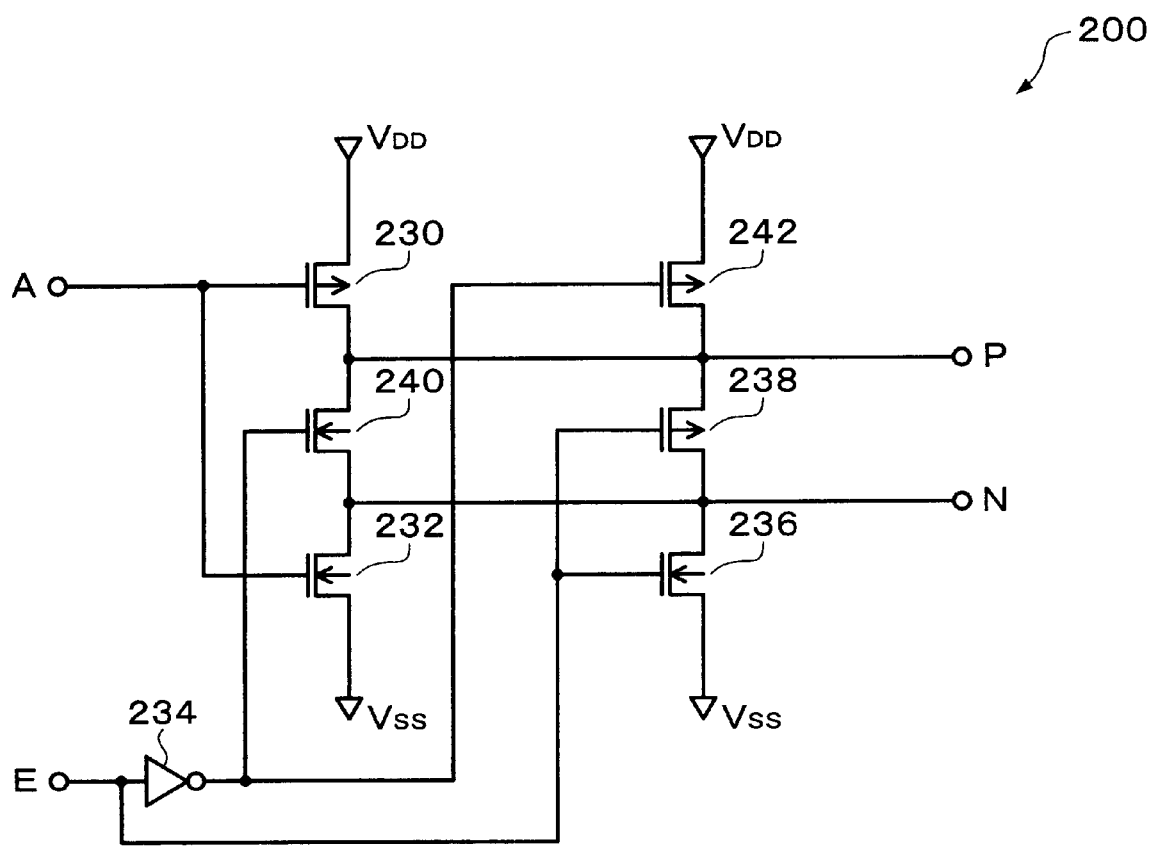
FIG. 5 is a circuit structural diagram schematically illustrating one example of the structure of a prebuffer circuit.

FIG. 5 schematically illustrates one example of the structure of the prebuffer circuit 200 shown in FIG. 4.

In the prebuffer circuit 200, a terminal A is electrically connected to both the gate electrode of a P-type transistor 230, whose source region is electrically connected to the power-supply level $V_{DD}$ and whose drain region is electrically connected to a terminal P, and the gate electrode of an N-type transistor 232 whose source region is electrically connected to the ground level $V_{SS}$. A terminal E is electrically connected to the input terminal of an inverter circuit 234, the gate electrode of an N-type transistor 236, whose source region is electrically connected to the ground level $V_{SS}$ and whose drain region is electrically connected to a terminal N, and the gate electrode of a P-type transistor 238 whose drain region and source region are electrically connected to the terminal N and the terminal P, respectively. The output terminal of the inverter circuit 234 is electrically connected to the gate electrode of an N-type transistor 240 whose drain region and source region are electrically connected to the terminal N and the terminal P, respectively, and the gate electrode of a P-type transistor 242, whose source region is electrically connected to the power-supply level $V_{DD}$ and whose drain region is electrically connected to the terminal P.

As a signal having a logic level "H" is input from the terminal E, the N-type transistor 236 is enabled, thus connecting the terminal N to the ground level $V_{SS}$, and the P-type transistor 238 is disabled. The output terminal of the inverter circuit 234 becomes a logic level "L", so that the P-type transistor 242 is enabled, thus connecting the terminal P to the power-supply level $V_{DD}$. That is, as the signal with the logic level "H" is input from the terminal E, the terminal P outputs a signal with the logic level "H" and the terminal N outputs a signal with the logic level "L", regardless of the signal at the terminal A.

As a signal having a logic level "L" is input from the terminal E, on the other hand, the N-type transistor 236 is disabled and the P-type transistor 238 and the N-type transistor 240 are enabled. Therefore, signals whose levels are the logic level from the terminal A inverted are output from the terminals P and N.

Figure 6:
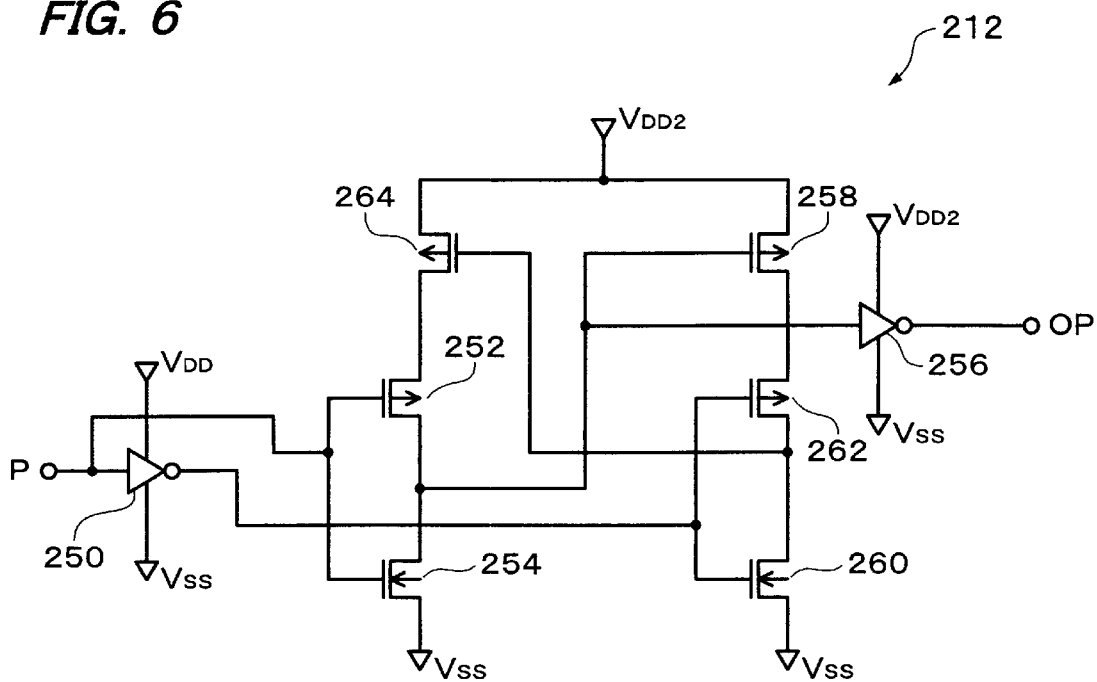
FIG. 6 is a circuit structural diagram schematically illustrating one example of the structure of a first level shifter circuit.

FIG. 6 schematically illustrates one example of the structure of the first level shifter circuit 212 shown in FIG. 4.

A terminal P is electrically connected to the input terminal of an inverter circuit 250, the gate electrode of a P-type transistor 252 and the gate electrode of an N-type transistor 254 whose source region is electrically connected to the ground level $V_{SS}$. The inverter circuit 250 is supplied with the power-supply level $V_{DD}$ and ground level $V_{SS}$, and its output corresponding to the logic level "H" is the potential difference between both levels. The drain region of the P-type transistor 252 and the drain region of the N-type transistor 254 are electrically connected together to the input terminal of an inverter circuit 256 and the gate electrode of a P-type transistor 258 whose source region is electrically connected to the power-supply level $V_{DD2}$. The inverter circuit 256 is supplied with the potential difference between the power-supply level $V_{DD2}$ and ground level $V_{SS}$, and its output corresponding to the logic level "H" is the potential difference between both levels.

The output terminal of the inverter circuit 250 is electrically connected to the gate electrode of an N-type transistor 260 whose source region is electrically connected to the ground level $V_{SS}$ and the gate electrode of a P-type transistor 262 whose source region is electrically connected to the drain region of the N-type transistor 260 and whose drain region is electrically connected to the drain region of the P-type transistor 258. The drain region of the N-type transistor 260 is electrically connected to the gate electrode of a P-type transistor 264 whose source region is electrically connected to the power-supply level $V_{DD2}$ and whose drain region is electrically connected to the source region of the P-type transistor 252.

The output terminal of the inverter circuit 256 is electrically connected to a terminal OP.

As a signal with the logic level "H" whose signal level is the power-supply level $V_{DD}$ is input from the terminal P, the N-type transistor 254 is enabled, connecting the input terminal of the inverter circuit 256 to the ground level $V_{SS}$. The inverter circuit 256 outputs the potential difference between the power-supply level $V_{DD2}$ and the ground level $V_{SS}$ from the terminal OP as the logic level "H".

When a signal with the logic level "L" is input from the terminal P, the signal level at the output terminal of the inverter circuit 250 becomes the logic level "H" which is the power-supply level $V_{DD}$, thereby enabling the N-type transistor 260. The P-type transistor 264 is enabled and the P-type transistor 252 which is enabled by the logic level "L" from the terminal P connects the input terminal of the inverter circuit 256 to the power-supply level $V_{DD2}$. Therefore, the inverter circuit 256 outputs the logic level "L" from the terminal OP.

Figure 7:
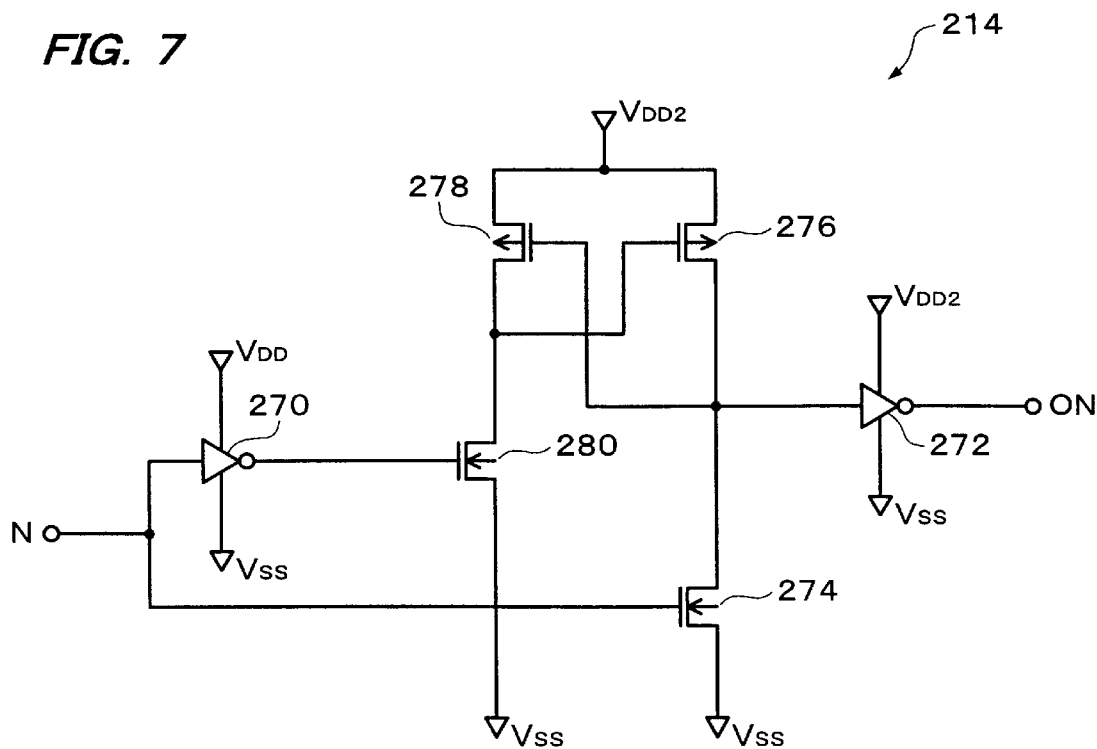
FIG. 7 is a circuit structural diagram schematically illustrating one example of the structure of a second level shifter circuit.

FIG. 7 schematically illustrates one example of the structure of the second level shifter circuit 214 shown in FIG. 4.

A terminal N is electrically connected to the input terminal of an inverter circuit 270 and the gate electrode of an N-type transistor 274 whose source region is electrically connected to the ground level and whose drain region is electrically connected to the input terminal of an inverter circuit 272. The inverter circuit 270 is supplied with the power-supply level $V_{DD}$ and ground level $V_{SS}$, and its output corresponding to the logic level "H" is the potential difference between both levels. The drain region of the N-type transistor 274 is electrically connected to the drain region of a P-type transistor 276 whose source region is electrically connected to the power-supply level $V_{DD2}$ and the gate electrode of a P-type transistor 278. The gate electrode of the P-type transistor 276, the drain region of the P-type transistor 278 and the drain region of an N-type transistor 280 are electrically connected together. The output terminal of the inverter circuit 270 is electrically connected to the gate electrode of the N-type transistor 280 whose source region is electrically connected to the ground level $V_{SS}$. The output terminal of the inverter circuit 272 is electrically connected to a terminal ON.

As a signal with the logic level "H" whose signal level is the power-supply level $V_{DD}$ is input from the terminal N, the N-type transistor 274 is enabled, connecting the input terminal of the inverter circuit 272 to the ground level $V_{SS}$. The inverter circuit 272 outputs the potential difference between the power-supply level $V_{DD2}$ and the ground level $V_{SS}$ from the terminal ON as the logic level "H".

When a signal with the logic level "L" is input from the terminal N, the signal level at the output terminal of the inverter circuit 270 becomes the logic level "H" which is the power-supply level $V_{DD}$, thereby enabling the N-type transistor 280. The P-type transistor 276 is enabled so that the input terminal of the inverter circuit 272 is connected to the power-supply level $V_{DD2}$. Therefore, the inverter circuit 272 outputs the logic level "L" from the terminal ON.

Figure 8:
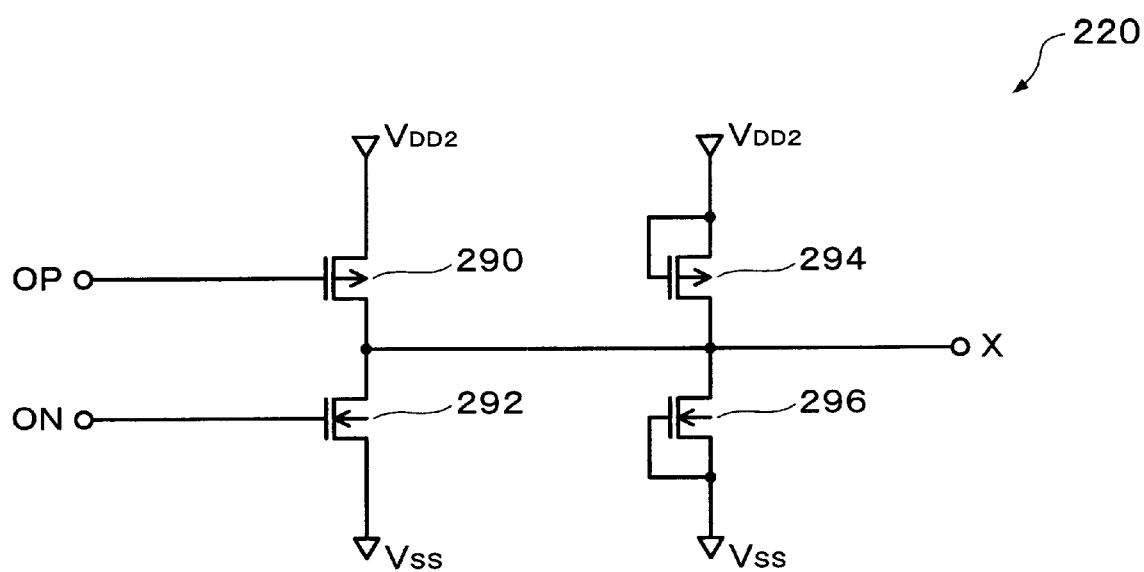
FIG. 8 is a circuit structural diagram schematically illustrating one example of the structure of an output buffer circuit.

FIG. 8 schematically illustrates one example of the structure of the output buffer circuit 220 shown in FIG. 4.

A terminal OP is electrically connected to the gate electrode of a P-type transistor 290 whose source region is electrically connected to the power-supply level $V_{DD2}$. A terminal ON is electrically connected to the gate electrode of an N-type transistor 292 whose source region is electrically connected to the ground level $V_{SS}$. The drain region of the P-type transistor 290 and the drain region of the N-type transistor 292 are electrically connected together and are further electrically connected to a terminal X, the drain region of a P-type transistor 294 whose gate electrode and source region are electrically connected to the power-supply level $V_{DD2}$ and the drain region of an N-type transistor 296 whose gate electrode and source region are electrically connected to the ground level $V_{SS}$.

That is, in accordance with signals from the terminals OP and ON, an output signal which operates on the potential difference between the power-supply level $V_{DD2}$ and the ground level $V_{SS}$ is output from the terminal X. When a signal with the logic level "L" is input from the terminal E shown in FIG. 4, therefore, the signals with the logic level "H" are input from the terminals OP and ON as mentioned above. As a result, the P-type transistor 290 and the N-type transistor 292 become disabled, thus setting the terminal X in a high-impedance state.

For example, I/O cells which include those circuits which are comprised of transistors are placed on a semiconductor chip as will be discussed below.

2.2 Lateral Placement of I/O Cells

In the following description, the placement of the I/O cells which makes the longitudinal direction perpendicular to the placement direction of the pads is called "lateral placement".

Figure 9:
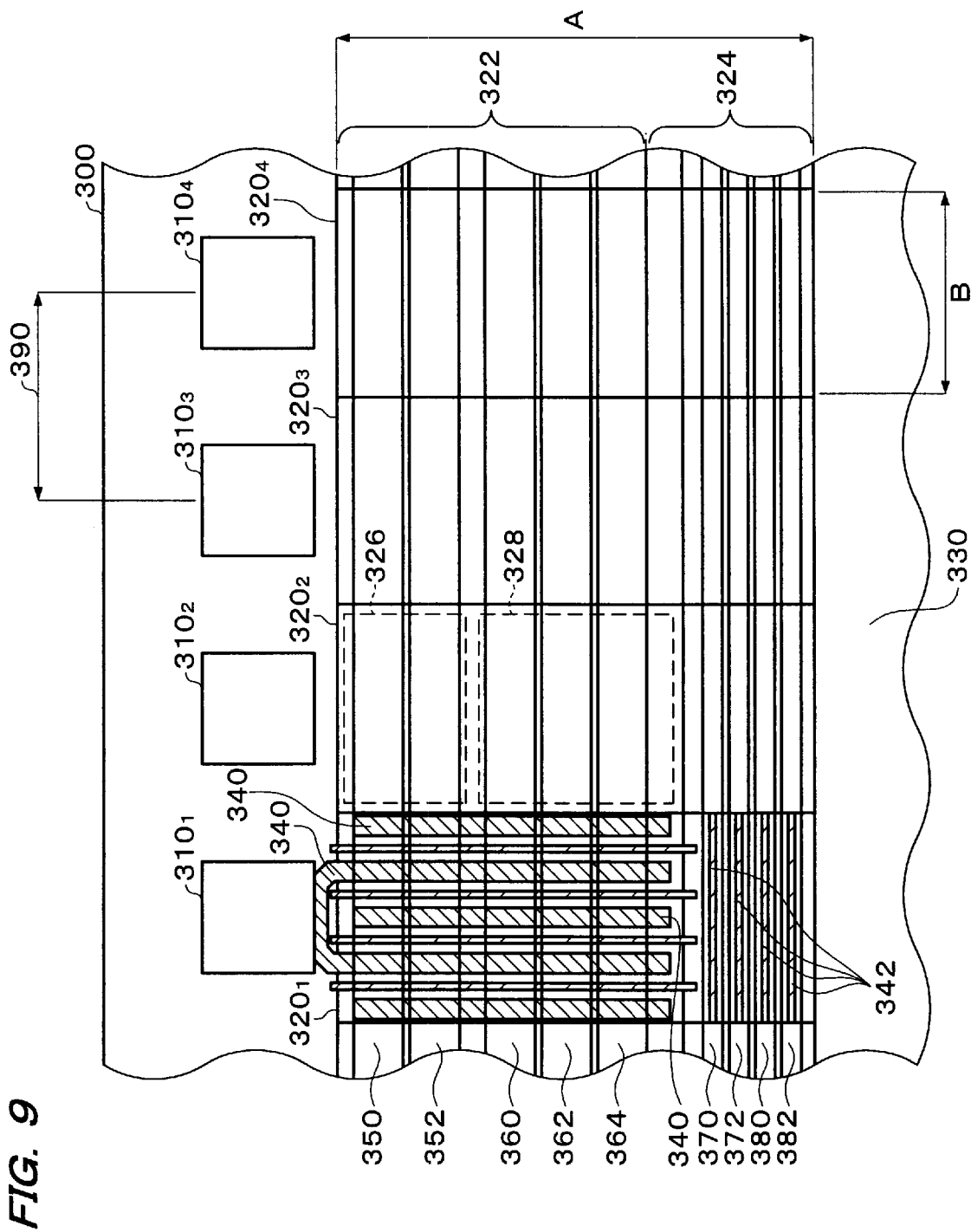
FIG. 9 is an explanatory diagram showing one example of the layout of I/O cells arranged laterally in the semiconductor device according to the embodiment.

FIG. 9 shows one example of the layout of I/O cells arranged laterally in the semiconductor device according to the embodiment.

Here, I/O cells $320_1$ to $320_4$ which are output cells shown in FIGS. 4 through 8 are placed in such a manner that the longitudinal direction become perpendicular to the placement direction of pads $310_1$ to $310_4$, in association with the pads $310_1$ to $310_4$ arranged along the outer peripheral portion of a semiconductor chip 300 of the semiconductor device according to the embodiment.

In FIG. 9, although the I/O cells $320_1$ to $320_4$ have similar structures, the I/O cell $320_1$ indicates an internal signal line that is formed by first-layer and second-layer interconnects and the I/O cell $320_2$ indicates a transistor region where the circuits that have been discussed in the foregoing description referring to FIGS. 4 to 8 are located.

Specifically, each I/O cell has a driver circuit portion 322 and an interface circuit portion 324 as indicated in the I/O cell $320_2$. The output buffer circuit shown in FIG. 8 is constructed in the driver circuit portion 322. The prebuffer circuit portion shown in FIG. 6 and the first and second level shifter circuits shown in FIG. 7 are constructed in the interface circuit portion 324. The interface circuit portion 324 performs a function of interfacing with a core transistor region 330.

The driver circuit portion 322 of each I/O cell has an N-type transistor region 326 and a P-type transistor region 328, in which a circuit of N-type transistors and a circuit of P-type transistors are respectively formed.

In the driver circuit portion 322 and the interface circuit portion 324, the internal power-supply level supply line and ground-level supply line and signal lines of the individual transistors are placed respectively by first-layer interconnects 340 and 342.

Ground-level supply lines 350 and 352 for feeding the ground level $V_{SS}$ to the N-type transistors or the like in the N-type transistor region 326 are formed over the N-type transistor region 326 of the driver circuit portion 322 by the second-layer interconnect. That is, as the internal interconnection of the driver circuit portion of an I/O cell is realized by the first-layer interconnect, a layer overlying the I/O cells laterally arranged along the outer peripheral portion of the semiconductor chip can be arranged in a ring form by the second-layer interconnect.

Likewise, power-supply level supply lines 360 and 362 for feeding the power-supply levels $V_{DD2}$ and $V_{DD}$ to the P-type transistors or the like in the P-type transistor region 328 or a ground-level supply line 364 for feeding the ground level $V_{SS}$ are formed over the P-type transistor region 328 of the driver circuit portion 322 by the second-layer interconnect. The power-supply level supply lines 360 and 362 and ground-level supply line 364 are likewise arranged in a ring form on a layer overlying the I/O cells, laterally arranged along the outer peripheral portion of the semiconductor chip, by the second-layer interconnect.

Power-supply level supply lines 370 and 372 for feeding the power-supply levels $V_{DD2}$ and $V_{DD}$ to the P-type transistors and N-type transistors, which constitute the prebuffer circuit and the first and second level shifter circuits shown in FIGS. 5 to 7, and ground-level supply lines 380 and 382 for feeding the ground level $V_{SS}$ are formed over the interface circuit portion 324 by the second-layer interconnect. The power-supply level supply lines 370 and 372 and ground-level supply lines 380 and 382 are likewise arranged in a ring form on a layer overlying the I/O cells, laterally arranged along the outer peripheral portion of the semiconductor chip, by the second-layer interconnect.

In this case, given that the length of the long side of each I/O cell is A and the length of the short side is B, the pads $310_1$ to $310_4$ can be placed with a pad pitch 390 which is set to approximately B.

2.3 Vertically Stacked Placement of I/O Cells

As mentioned earlier, as [A/B] or fewer columns of I/O cells are placed in such a manner that, as shown in FIG. 2, the longitudinal direction of the I/O cells become parallel to the placement direction of the pads and plural levels of I/O cells mentioned above are arranged from the outer peripheral portion of the semiconductor chip toward the chip center portion, the degree of freedom of designing the pad pitch can be improved. Such a placement of I/O cells is hereinafter called "vertically stacked placement".

Figure 10:
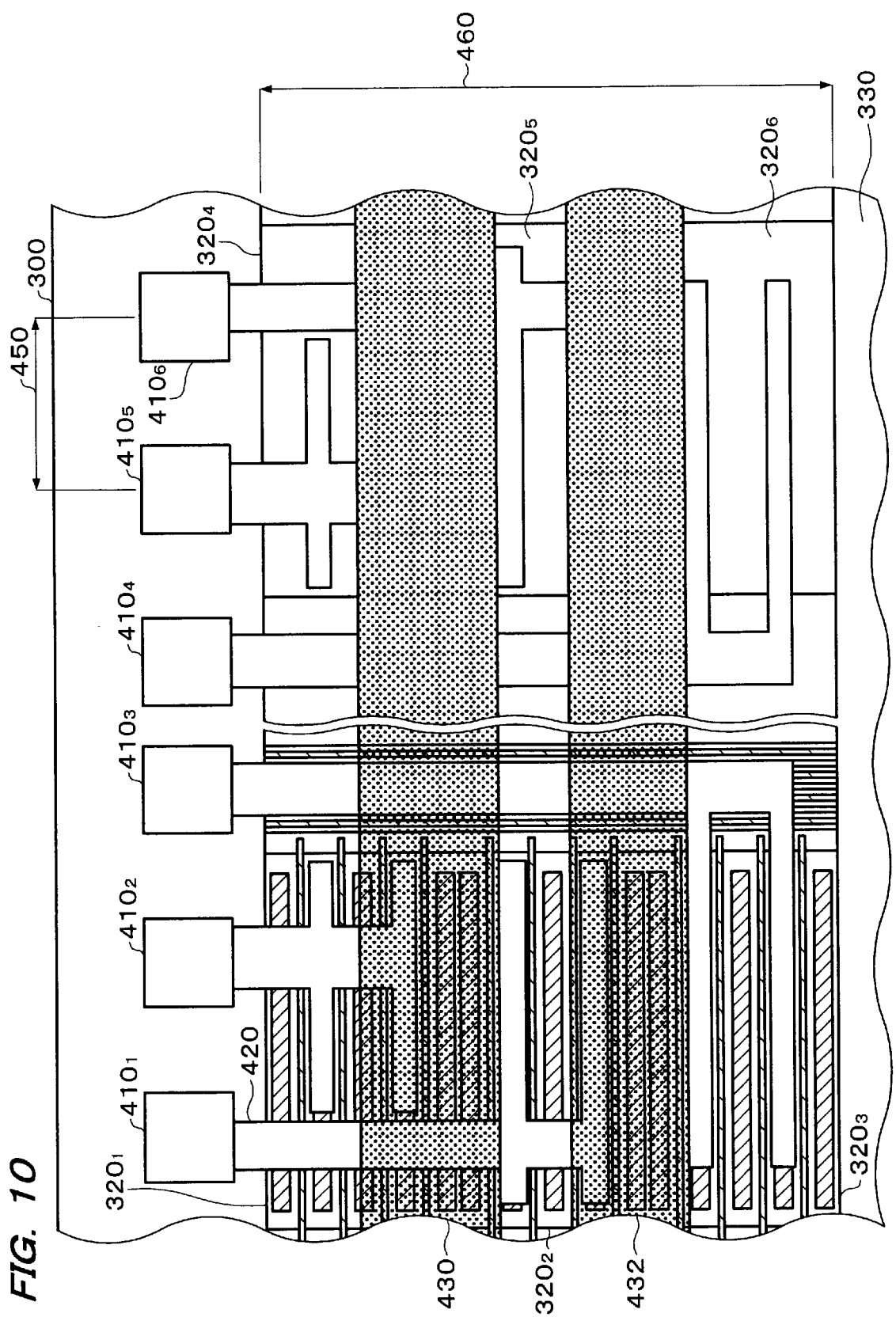
FIG. 10 is an explanatory diagram showing one example of the layout of I/O cells arranged in a vertically stacked fashion in the semiconductor device according to the embodiment.

FIG. 10 shows one example of the layout of I/O cells arranged in a vertically stacked fashion in the semiconductor device according to the embodiment.

FIG. 10 exemplifies the vertical 3-level stacked placement on the assumption that [A/B] is "3". When "A" is greater than "3B", therefore, the pad pitch can be increased and the chip area can be reduced without changing the internal core transistor region.

In this example, the I/O cells $320_1$ to $320_6$ which are output cells shown in FIGS. 4 through 8 are arranged in a vertical 3-level stacked fashion in association with the pads $410_1$ to $410_6$ arranged along the outer peripheral portion of the semiconductor chip 300 of the semiconductor device according to the embodiment. Specifically, the I/O cells laterally arranged as shown in FIG. 9 are stacked vertically with the internal first and second interconnects intact, and third-layer and fourth-layer interconnects are additionally provided to connect to the first-layer or second-layer interconnect that is placed in each I/O cell. The interface circuit portions of the I/O cells placed in the vertical 3-level stacked fashion are so arranged as to face the corresponding interface circuit portions of the I/O cells in adjoining I/O cell groups placed in the vertical 3-level stacked fashion.

The pads $410_1$, $410_2$, $410_3$, $410_4$, $410_5$ and $410_6$ are electrically connected by a third-layer interconnect 420 in association with $320_3$, $320_1$, $320_2$, $320_6$, $320_4$ and $320_5$.

The I/O cells $320_1$ to $320_3$ illustrate the connecting relation between the internal first-layer and second-layer interconnects and the individual pads. The I/O cells $320_4$ to $320_6$, on the other hand, illustrate the connecting relation between the third-layer and fourth-layer interconnects, omitting the first-layer and second-layer interconnects.

A ground-level supply line 430 and a power-supply level supply line 432 for feeding the ground level $V_{SS}$ and the power-supply level $V_{DD}$ are placed over those I/O cells by the fourth-layer interconnect. As the interconnection of the I/O cells is made by the first-layer and second-layer interconnects and the interconnection between the I/O cells and the pads is made by the third-line interconnect, a layer overlying the I/O cells placed in the vertical 3-level stacked fashion along the outer peripheral portion of the semiconductor chip can be designed in a ring form by the fourth-layer interconnect.

A pad pitch 450 in this case is not limited to the width B of the I/O cells, ensuring the pad placement more freely, and the chip area can be made smaller than that in the case where the height of the I/O cells is "A" because a height-directional length 460 of the I/O cell placement region becomes "3B".

As the interface circuit portions in the individual I/O cells in adjoining I/O cell groups are arranged to face one another, the power-supply level supply lines for multiple power supplies that are needed in, for example, the level shifter circuits can be shared. This can significantly improve the degree of freedom of the placement in the I/O cell placement region and increase the width of the power supply lines as an EMI countermeasure.

The invention is not limited to the embodiment but may be modified in various other forms within the scope of the invention.

Although it has been explained in the foregoing description of the embodiment that the pads are arranged along the outer peripheral portion of the semiconductor chip, the embodiment is not limited to this particular type. For example, the pads may be arranged in a zigzag form along the outer peripheral portion of the semiconductor chip or the pads may be placed in the active transistor region as in the case of active surface bumps.

Although it has been explained in the foregoing description of the embodiment that each I/O cell is of the double power supply type to which first and second power-supply levels are supplied and which comprises a driver circuit portion and an interface circuit portion, the embodiment is not limited to this particular type. The invention can also be adapted to an I/O cell of the type to which three or more power-supply levels are supplied and which comprises a plurality of circuit portions correspond with those power-supply levels.

What is claimed is:

1. An I/O cell placement method for placing I/O cells which are included in a semiconductor device, the I/O cells being electrically connected to a given external device via corresponding pads and having electric interface function with respect to the external device, the method comprising a step of:

placing at least two columns of I/O cells from an outer peripheral portion of a chip toward a chip core portion so that a longitudinal direction of each of the I/O cells is parallel to the outer peripheral portion, and parallel to a placement direction of the corresponding pads.

2. The I/O cell placement method according to claim 1, wherein a plurality of pads are placed along the outer peripheral portion of the chip, and
wherein the pads are electrically connected to corresponding I/O cells respectively.

3. The I/O cell placement method according to claim 2, wherein the plurality of pads are placed at a region closer to a chip core portion than the I/O cells, and
wherein the pads are electrically connected to corresponding I/O cells respectively.

4. An I/O cell placement method for placing I/O cells which are included in a semiconductor device electrically connected to a given external device and have electric interface function with respect to the external device, the method comprising a step of:
placing at least two columns of I/O cells from an outer peripheral portion of a chip toward a chip core portion so that a longitudinal direction of each of the I/O cells is parallel to the outer peripheral portion, wherein, when A is a longitudinal length of a region of an I/O cell and B is another length of a region of the I/O cell, [A/B] or fewer columns of I/O cells are placed so that the longitudinal direction of the I/O cells are parallel to one another.

5. An I/O cell placement method for placing I/O cells which are included in a semiconductor device electrically connected to a given external device and have electric interface function with respect to the external device, the method comprising a step of:
placing at least two columns of I/O cells from an outer peripheral portion of a chip toward a chip core portion so that a longitudinal direction of each of the I/O cells is parallel to the outer peripheral portion, wherein, when A is a longitudinal length of a region of the I/O cell and B is another length of a region of the I/O cell, more than [A/B] columns of I/O cells are placed so that the longitudinal direction of the I/O cells are parallel to one another.

6. An I/O cell placement method for placing I/O cells which are included in a semiconductor device electrically connected to a given external device and have electric interface function with respect to the external device, the method comprising a step of:
placing at least two columns of I/O cells from an outer peripheral portion of a chip toward a chip core portion so that a longitudinal direction of each of the I/O cells is parallel to the outer peripheral portion, wherein each of the I/O cells has a plurality of regions including first and second regions to which first and second power sources are respectively connected, and the I/O cells are placed so that the second region of each of the I/O cells to which the second power source is connected faces each other when the I/O cells are adjoining each other in the longitudinal direction.

7. The I/O cell placement method according to claim 6, wherein a level of the second power source is a level of power source to be supplied to the chip core portion, and a level shifter circuit which performs signal level conversion between a level of the first power source and a level of the second power source is located in the second region to which a level of the second power source is supplied.

8. An I/O cell placement method for placing I/O cells which are included in a semiconductor device electrically connected to a given external device and have electric interface function with respect to the external device, the method comprising a step of:
placing at least two columns of I/O cells from an outer peripheral portion of a chip toward a chip core portion so that a longitudinal direction of each of the I/O cells is parallel to the outer peripheral portion, wherein at least layers other than interconnection layers in the I/O cells are the same in a first case where the I/O cells are placed in a first placement direction and in a second case where the I/O cells are placed in a second placement direction which is a rotated first placement direction.

9. The I/O cell placement method according to claim 8, wherein in the I/O cells, a level of a power-supply is supplied through a first interconnection layer in the first case and a level of the power-supply is supplied through a second interconnection layer connected to the first interconnection layer in the second case.

10. A semiconductor device having I/O cells electrically connected to a given external device via corresponding pads, comprising:
at least two columns of I/O cells which are placed from an outer peripheral portion of a chip toward a chip core portion so that a longitudinal direction of the I/O cell is parallel to the outer peripheral portion, parallel to a placement direction of the corresponding pads, and have an electric interface function with respect to the external device.

11. The semiconductor device according to claim 10, wherein a plurality of pads are placed along an outer peripheral portion of the chip and electrically connected to corresponding I/O cells respectively.

12. The semiconductor device according to claim 10, further including pads placed at a region closer to a chip core portion than the I/O cells and electrically connected to corresponding I/O cells respectively.

13. A semiconductor device electrically connected to a given external device, comprising:
at least two columns of I/O cells which are placed from an outer peripheral portion of a chip toward a chip core portion so that a longitudinal direction of the I/O cell is parallel to the outer peripheral portion and have an electric interface function with respect to the external device, wherein, when A is a longitudinal length of a region of the I/O cell and B is another length of a region of the I/O cell, [A/B] or fewer columns of I/O cells are placed so that the longitudinal direction of the I/O cells are parallel to one another.

14. A semiconductor device electrically connected to a given external device, comprising:
at least two columns of I/O cells which are placed from an outer peripheral portion of a chip toward a chip core portion so that a longitudinal direction of the I/O cell is parallel to the outer peripheral portion, the I/O cells having an electric interface function with respect to the external device, wherein, when A is a longitudinal length of a region of the I/O cell and B is another length of a region of the I/O cell, more than [A/B] columns of I/O cells are placed so that the longitudinal direction of the I/O cells are parallel to one another.

15. A semiconductor device electrically connected to a given external device, comprising:
at least two columns of I/O cells which are placed from an outer peripheral portion of a chip toward a chip core portion so that a longitudinal direction of the I/O cell is parallel to the outer peripheral portion, the I/O cells having an electric interface function with respect to the external device, wherein each of the I/O cells has a plurality of regions including first and second regions to which first and second power sources are respectively connected, and the I/O cells are placed so that the second region of each of the I/O cells to which the second power source is connected faces each other when the I/O cells are adjoining each other in the longitudinal direction.

16. The semiconductor device according to claim 15, wherein a level of the second power source is a level of power source to be supplied to the chip core portion, and a level shifter circuit which performs signal level conversion between a level of the first power source and a level of the second power source is located in the second region to which a level of the second power source is supplied.

* * * * *